(12) United States Patent
Singh

(10) Patent No.: US 7,235,824 B1
(45) Date of Patent: Jun. 26, 2007

(54) ACTIVE GATE CCD IMAGE SENSOR

(75) Inventor: Surendra Singh, Waterloo (CA)

(73) Assignee: Dalsa, Inc., Waterloo, Ontario (CA)

( * ) Notice: Subject to any disclaimer, the term of this patent is extended or adjusted under 35 U.S.C. 154(b) by 1003 days.

(21) Appl. No.: 09/877,050

(22) Filed: Jun. 11, 2001

Related U.S. Application Data

(60) Provisional application No. 60/223,964, filed on Aug. 9, 2000.

(51) Int. Cl.
*H01L 27/148* (2006.01)

(52) U.S. Cl. .................... 257/217; 257/222; 257/224; 257/245

(58) Field of Classification Search ............... 257/217, 257/222, 224, 247, 245
See application file for complete search history.

(56) References Cited

U.S. PATENT DOCUMENTS

| | | | | |
|---|---|---|---|---|
| 3,739,240 A | | 6/1973 | Krambeck | 317/235 R |
| 3,790,825 A | * | 2/1974 | Barron et al. | 257/217 |
| 4,151,539 A | * | 4/1979 | Barron et al. | 257/217 |
| 4,229,752 A | * | 10/1980 | Hynecek | 257/217 |
| 4,300,151 A | | 11/1981 | Nishizawa | 357/24 |
| 4,612,521 A | * | 9/1986 | Kleefstra et al. | 257/217 |
| 4,725,872 A | * | 2/1988 | Blouke et al. | 257/217 |
| 4,779,124 A | | 10/1988 | Hynecek | 357/24 |
| 4,814,843 A | | 3/1989 | Nishizawa | 357/24 |
| 5,060,245 A | | 10/1991 | Nelson | 377/60 |
| 5,151,380 A | | 9/1992 | Hynecek | 437/53 |
| 5,235,196 A | | 8/1993 | Anagnostopoulos et al. | 257/223 |
| 5,286,990 A | | 2/1994 | Hynecek | 257/247 |
| 5,502,318 A | | 3/1996 | Hynecek | 257/217 |
| 5,567,641 A | | 10/1996 | Hynecek | 437/53 |
| 5,614,740 A | | 3/1997 | Gardner et al. | 257/222 |
| 5,923,370 A | | 7/1999 | Miethig et al. | 348/320 |

* cited by examiner

*Primary Examiner*—Ori Nadav
(74) *Attorney, Agent, or Firm*—Millen, White, Zelano & Branigan, P.C.

(57) ABSTRACT

An active gate includes a substrate of a first conductivity type, a channel of a second conductivity type formed in the substrate, a first gate region of the first conductivity type formed in a corresponding first portion of the channel, and a first contact connected to the first gate region. The first gate region covers a first area, and the first contact covers a fraction of the first area. A pixel or register element includes an active gate, a second gate region of the first conductivity type formed in a corresponding second portion of the channel, and a second contact connected to the second gate region. The second gate region covers a second area and is spaced by a first gap from the first gate region. The second contact covers a fraction of the second area. The pixel or register element further includes a first gate electrode insulatively spaced from and disposed over the first gap.

30 Claims, 8 Drawing Sheets

ACTIVE GATE CCD IMAGE SENSOR

The priority benefit of the Aug. 9, 2000 filing date of provisional application 60/223,964 is hereby claimed.

BACKGROUND OF THE INVENTION

1. Field of the Invention

The present invention relates to photo detectors for charge coupled device sensors. In particular, the invention relates to an active gate photo diode.

2. Description of Related Art

In FIG. 1, a known photo gate includes substrate 2, channel 4 formed in substrate 2, insulator 6 formed over channel 4, gate electrode 8 formed over insulator 6 and connection 10 through which voltage V1 is applied to gate electrode 8. Typically, substrate 2 is lightly doped silicon of a p type conductivity. Substrate 2 may be an epitaxy layer formed on other silicon or on an insulator. Substrate 2 may be a well of a p type conductivity formed in other silicon. Typically, channel 4 is of n type conductivity and typically formed in the substrate by ion implant or dopant diffusion. Typically, insulator 6 is a combined film of silicon dioxide and silicon nitride, but may be formed of other insulators. Gate electrode 8 is usually formed of doped poly-crystalline silicon (i.e., poly). It would make no sense to use an aluminum layer as gate electrode 8 since aluminum would block light radiation, and the photo gate would not function. Quite often in an array of photo gates, gate electrodes 8, for an entire row of photo gates, are connected together with one elongate film of poly so as to provide the needed connection 10.

In CCD sensors, two of such gates are combined to make a two phase photo detector element, three of such gates are combined to make a three phase photo detector element, or four of such gates are combined to make a four phase photo detector element. Such detectors are covered by the doped poly-crystalline silicon that constitutes the gate electrodes.

Most existing CCD sensors have low sensitivity to blue and UV because their overlying poly-crystalline silicon electrodes are mostly opaque at these wavelengths. There are four common techniques used to overcome this limitation. Interline transfer (ILT) CCD sensors use photo diodes as the photo detector element. The ILT CCD couples the photo diode, either directly or indirectly, through a transfer gate to a vertical CCD shift register. Indirect coupling stores charge in an intermediate storage well before transferring the charge to a vertical CCD. Open pinned-phase (OPP) CCD sensors use pinned photo diodes in the ILT structure. Windowed poly-crystalline silicon CCD sensors, also called reticulated photo gate sensors, use poly gates as depicted in FIG. 1; however, a portion of the poly is etched away to open a window so that photons can reach the underlying silicon. The windowed or reticulated portion of the photo gate functions as a photo diode. Some CCD sensors have had their backsides thinned, and the light is exposed through the back side.

While the ILT, OPP and windowed poly-crystalline silicon CCD sensors have improved UV detection sensitivity with respect to a poly photo gate CCD sensor, their fill factors are reduced, and their UV performance still needs to be improved. While the back side thinned CCD sensors may have good UV sensitivity, the manufacturing process is expensive and the modulation transfer function (MTF) is reduced.

SUMMARY OF THE INVENTION

It is an object to the present invention to overcome limitations of the prior art. It is a further object of the present invention to achieve a photo detector element with improved blue or UV detection sensitivity when compared to poly photo gate technology.

These and other objects are achieved in an active gate that includes a substrate of a first conductivity type, a channel of a second conductivity type formed in the substrate, a first gate region of the first conductivity type formed in a corresponding first portion of the channel, and a first contact connected to the first gate region. The first gate region covers a first area, and the first contact covers a fraction of the first area.

In an alternative embodiment, these and other objects are achieved in a device that includes a substrate of a first conductivity type, a channel of a second conductivity type formed in the substrate, a first gate region of the first conductivity type formed in a corresponding first portion of the channel, a second gate region of the first conductivity type formed in a corresponding second portion of the channel, and first and second contacts connected to respective first and second gate regions. The first and second gate regions cover respective first and second areas, and the first and second contacts cover a fraction of the respective first and second areas. The second gate region is spaced by a first gap from the first gate region, and the device further includes a first gate electrode insulatively spaced from and disposed over the first gap.

In an alternative embodiment, these and other objects are achieved in a device that includes a substrate of a first conductivity type, a channel of a second conductivity type formed in the substrate, a first gate region of the first conductivity type formed in a corresponding first portion of the channel, a second gate region of the first conductivity type formed in a corresponding second portion of the channel, and first and second contacts connected to respective first and second gate regions. The first and second gate regions cover respective first and second areas, and the first and second contacts cover a fraction of the respective first and second areas. The second gate region is spaced by a first gap from the first gate region, and the device further includes a first gate electrode insulatively spaced from and disposed over a first portion of the first gap, and a second gate electrode insulatively spaced from and disposed over a second portion of the first gap. The second gate electrode is insulatively spaced from and disposed adjacent to the first gate electrode.

In an alternative embodiment, these and other objects are achieved in a device that includes a substrate of a first conductivity type, first and second active gate channels of a second conductivity type formed in respective portions the substrate, a first gate region of the first conductivity type formed in a corresponding first portion of the first active gate channel, a second gate region of the first conductivity type formed in a corresponding second portion of the second active gate channel, and first and second contacts connected to respective first and second gate regions. The first and second gate regions cover respective first and second areas, and the first and second contacts cover a fraction of the respective first and second areas. The second active gate channel is spaced by a first gap from the first active gate channel, and the device further includes a first gate electrode insulatively spaced from and disposed over the first gap.

In an alternative embodiment, these and other objects are achieved in a device that includes a substrate of a first conductivity type, first and second active gate channels of a second conductivity type formed in respective portions the substrate, a first gate region of the first conductivity type formed in a corresponding first portion of the first active gate channel, a second gate region of the first conductivity type formed in a corresponding second portion of the second active gate channel, and first and second contacts connected to respective first and second gate regions. The first and second gate regions cover respective first and second areas, and the first and second contacts cover a fraction of the respective first and second areas. The second active gate channel is spaced by a first gap from the first active gate channel, and the device further includes a first gate electrode insulatively spaced from and disposed over a first portion of the first gap, and a second gate electrode insulatively spaced from and disposed over a second portion of the first gap. The second gate electrode is insulatively spaced from and disposed adjacent to the first gate electrode.

In an alternative embodiment, these and other objects are achieved in an active gate that includes a substrate of a first conductivity type, a channel of a second conductivity type formed in the substrate, a first active gate channel of the second conductivity type formed in a corresponding first portion of the channel, a first gate region of the first conductivity type formed in a corresponding first portion of the first active gate channel, and a first contact connected to the first gate region. The first gate region covers a first area, and the first contact covers a fraction of the first area. The first active gate channel has a greater dopant concentration than a concentration of the channel.

In an alternative embodiment, these and other objects are achieved in a device that includes a substrate of a first conductivity type, a channel of a second conductivity type formed in the substrate, a first active gate channel of the second conductivity type formed in a corresponding first portion of the channel, a second active gate channel of the second conductivity type formed in a corresponding second portion of the channel, a first gate region of the first conductivity type formed in a corresponding first portion of the first active gate channel, a second gate region of the first conductivity type formed in the second active gate channel, and first and second contacts connected to the respective first and second gate regions. The first gate region covers a first area, and the first contact covers a fraction of the first area. The second gate region covers a second area, and the second contact covers a fraction of the second area. The first active gate channel has a greater dopant concentration than a concentration of the channel, and the second active gate channel has a greater dopant concentration than the concentration of the channel. The second gate region is spaced by a first gap from the first gate region, and the device further includes a first gate electrode insulatively spaced from and disposed over the first gap.

In an alternative embodiment, these and other objects are achieved in a device that includes a substrate of a first conductivity type, a channel of a second conductivity type formed in the substrate, a first active gate channel of the second conductivity type formed in a corresponding first portion of the channel, a second active gate channel of the second conductivity type formed in a corresponding second portion of the channel, a first gate region of the first conductivity type formed in a corresponding first portion of the first active gate channel, a second gate region of the first conductivity type formed in the second active gate channel, and first and second contacts connected to the respective first and second gate regions. The first gate region covers a first area, and the first contact covers a fraction of the first area. The second gate region covers a second area, and the second contact covers a fraction of the second area. The first active gate channel has a greater dopant concentration than a concentration of the channel, and the second active gate channel has a greater dopant concentration than the concentration of the channel. The second gate region is spaced by a first gap from the first gate region, and the device further includes a first gate electrode insulatively spaced from and disposed over a first portion of the first gap, and a second gate electrode insulatively spaced from and disposed over a second portion of the first gap. The second gate electrode is insulatively spaced from and disposed adjacent to the first gate electrode.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 2:
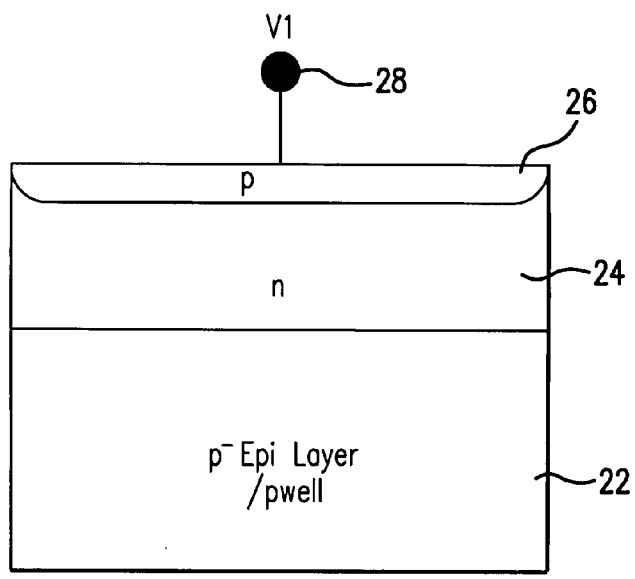
FIG. 2 is a section view of an active gate or photo gate according to the present invention.

In FIG. 2, a new type of gate, called an active gate, includes substrate 22, channel 24 formed in substrate 22, gate region 26 formed in a portion of channel 24 and contact 28, formed on gate region 26, through which voltage V1 is applied to gate region 26. Typically, substrate 22 is lightly doped silicon of a p type conductivity. Substrate 22 may be an epitaxy layer formed on other silicon or on an insulator. Substrate 22 may also be a well of a p type conductivity formed in other silicon. Typically, channel 24 is of n type conductivity and formed in the substrate by ion implant or dopant diffusion. Gate region 26 is formed as a shallow region of a p type conductivity within channel 24. Substrate 22 and gate region 26 are of like conductivity type, and channel 24 is of an opposite conductivity type. Contact 28 is preferably formed of Ti/W or TiN/W or other suitable material to form a contact with gate region 26 that is shallow with respect to the depth of gate region 26. Gate region 26 covers a first predetermined area, and contact 28 covers a fraction of the first predetermined area. The smaller this fraction is, the greater will be the available area for improved UV detection sensitivity.

In operation, the junction between channel 24 and gate region 26 is back biased to form a space charge layer there between. Photon impacting the active gate generate photo charge that is collected in the channel in a way similar to the way that photo charge is collected in the channel of a pinned photo diode. However, with a pinned photo diode, the voltage applied to a shallow p region in the upper depth of the channel is pinned to the voltage applied to the substrate. In the present invention, an external voltage (V1) is applied to gate region 26, and the external voltage can be increased or decreased from the voltage of the substrate so that gate region 26 behaves like a controllable gate electrode and the active gate (FIG. 2) can be used as a photo gate or used in a CCD shift register as a register element or both.

An advantage of this structure is that it has the flexible advantage of a photo gate (the potential of the well can be clocked) while at the same time has the blue and UV response of a pinned photo diode.

Figure 3:
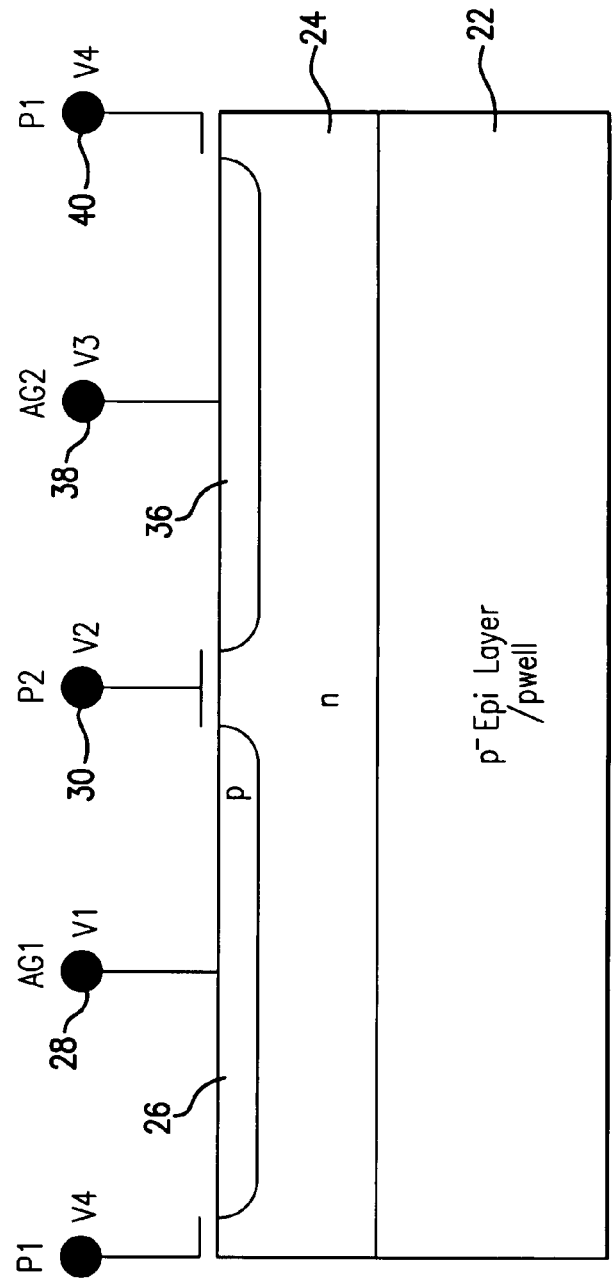
FIG. 3 is a section view of a first embodiment of a pixel or register element employing an active gate according to the present invention.
Figure 4:
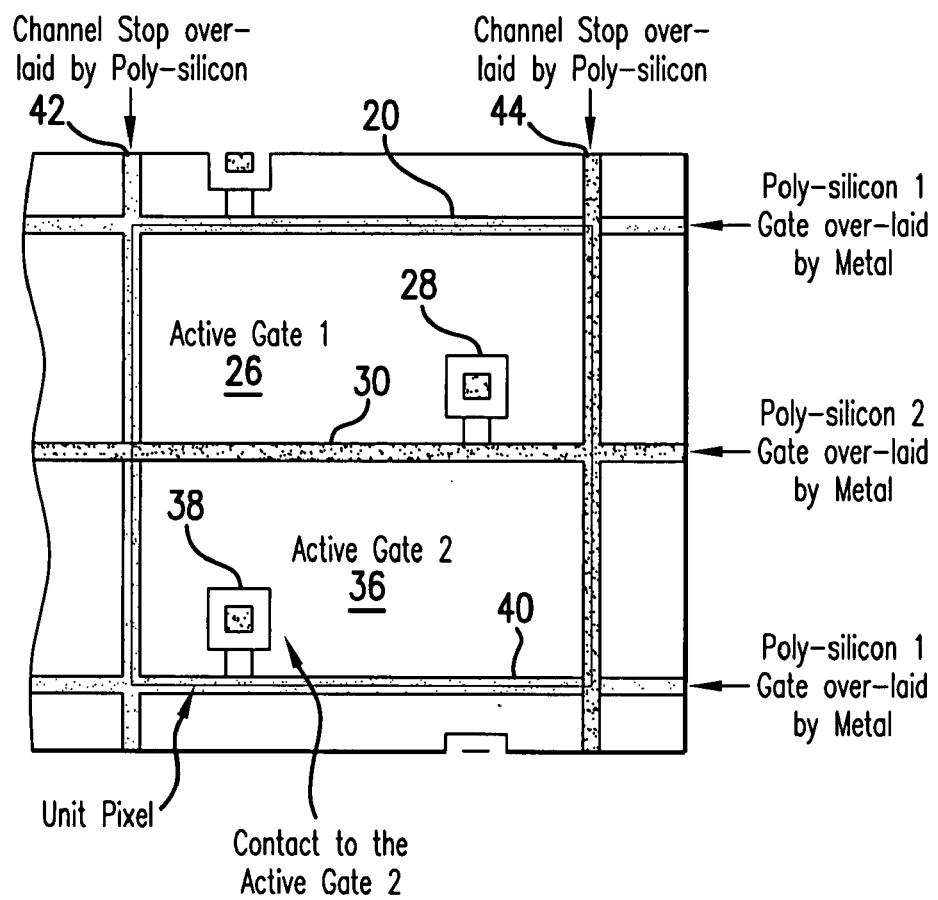
FIG. 4 is a plan view of the pixel of FIG. 3.

In FIGS. 3 and 4, a new type of pixel, an active gate pixel, includes a first active gate as depicted in FIG. 2, gate region 36 formed in channel 24 and contact 38 through which voltage V3 is applied to gate region 36. Gate region 36 covers a second predetermined area, and contact 38 covers a fraction of the second predetermined area. Substrate 22, channel 24, gate region 36 and contact 38 constitute a second active gate. Gate region 36 is spaced by a first gap from gate region 26. First gate electrode 30 is insulatively spaced from and disposed over the first gap. In FIG. 4, the first and second active gate regions are formed in channel 24 and bound between first and second channel stops 42, 44. A CCD type shift register is formed between the channel stops by the first and second active gates and poly gate electrode 30 therebetween.

When appropriate clock voltage levels are applied to poly P1, active gate contact AG1, poly P2 and active gate contact AG2 in the correct sequence, charges in wells beneath the gates are transferred up or down the shift register. For example, if the voltage applied to poly first gate electrode 30 were to transition from −6 volts to −3 volts, the potential in the well created beneath the electrode would transition from 3 volts to 6 volts. Similarly, if the voltage applied to an active gate (e.g., gate region 26 or 36) were to transition from 0 volts to 3 volts, the potential in the well created beneath the gate region would transition from 5 volts to 8 volts. Persons of ordinary skill in the art will appreciate in light of these teachings that plural pixels of the type described with respect to FIGS. 3 and 4 may be linked together to form a long, multi-element, shift register with from as few as two elements to as many elements as can fit within the design rules and limitations of the fabricator. When two pixels are disposed adjacent in a shift register, a gate region of the first pixel is spaced by a second gap from a gate region of the second pixel. Second gate electrode 40 is insulatively spaced from and disposed over the second gap.

Figure 5:
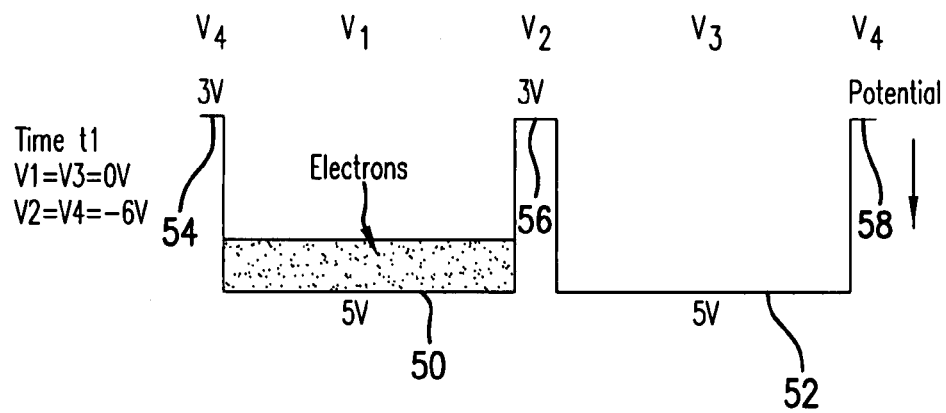
FIGS. 5, 6 and 7 are potential well diagrams depicting the operation of a pixel depicted in FIGS. 3 and 4.

FIG. 5 is a potential well diagram depicting the potential of wells beneath gate electrodes of the pixel depicted in FIGS. 3 and 4 at time t1. In FIG. 5, voltages V1 and V3 are set to zero volts relative to substrate 22. Voltage V1 is applied to active gate AG1 at gate region 26 inducing a potential of 5 volts in the well beneath gate region 26, and voltage V3 is applied to active gate AG2 at gate region 36 inducing a potential of 5 volts in the well beneath gate region 36. At the same time, voltages V2 and V4 are set to −6 volts relative to substrate 22. Voltage V2 is applied to poly gate P2 at gate electrode 30 inducing a potential of 3 volts in the well beneath gate electrode 30, and voltage V4 is applied to poly gate P1 at gate electrode 40 inducing a potential of 3 volts in the well beneath gate electrode 40.

At time t1, the potential of the well at 50 beneath gate region 26 is 5 volts, and the potential of wells at 54 and 56 beneath poly electrodes on either side of gate region 26 is 3 volts. Photo charge or other charge (electrons with a negative charge) will naturally become trapped in well 50 beneath gate region 26. Similarly at time t1, the potential of the well at 52 beneath gate region 36 is 5 volts, and the potential of wells 56 and 58 beneath poly electrodes on either side of gate region 36 is 3 volts. Photo charge or other charge (electrons with a negative charge) will naturally become trapped in well 52 beneath gate region 36. The 3 volt potential of wells 54, 56 and 58 beneath the poly electrodes serve as barriers against electron diffusion from wells 50 and 52 beneath gate regions 26 and 36 (set to 5 volts). As electrons accumulate in the 5 volt wells, the wells change potential. As long as the charge accumulated in a well divided by the well's capacitance is less than 2 volts, additional charge will not spill over the 3 volt barriers created by wells 54, 56 and 58 beneath the gate electrodes to either side of active gate wells 50 and 52.

Figure 6:
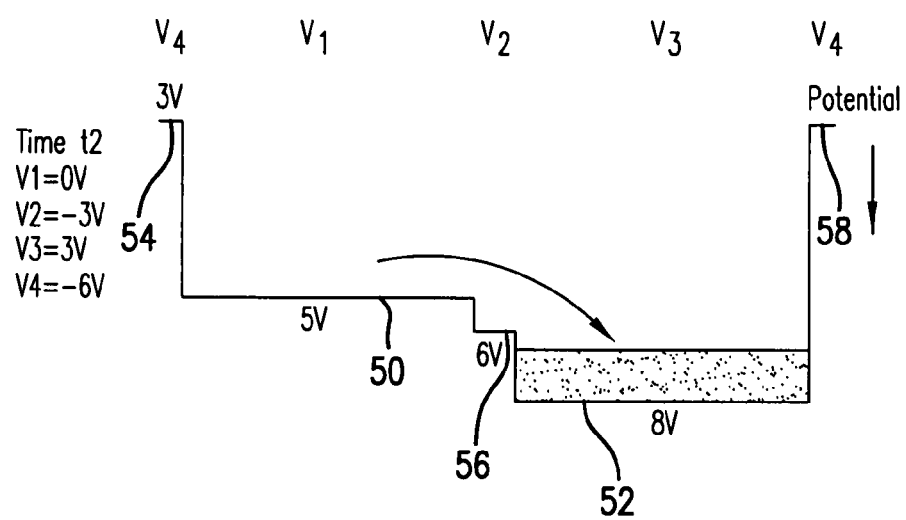

FIG. 6 is a potential well diagram depicting the potential of wells beneath gate electrodes of the pixel depicted in FIGS. 3 and 4 at time t2. At time t2, the potential of the well at 50 beneath gate region 26 remains 5 volts, and the potentials of wells at 54 and 58 beneath poly electrodes on either side of the pixel remain 3 volts. However, voltage V3 is set to 3 volts and applied to active gate AG2 at gate region 36 inducing a potential of 8 volts in well 52 beneath gate region 36. Voltage V2 is set to −3 volts and applied to poly electrode 30 inducing a potential of 6 volts in well 56 beneath poly electrode 30. Electrons that were trapped in well 50 are then transferred to well 52.

Figure 7:
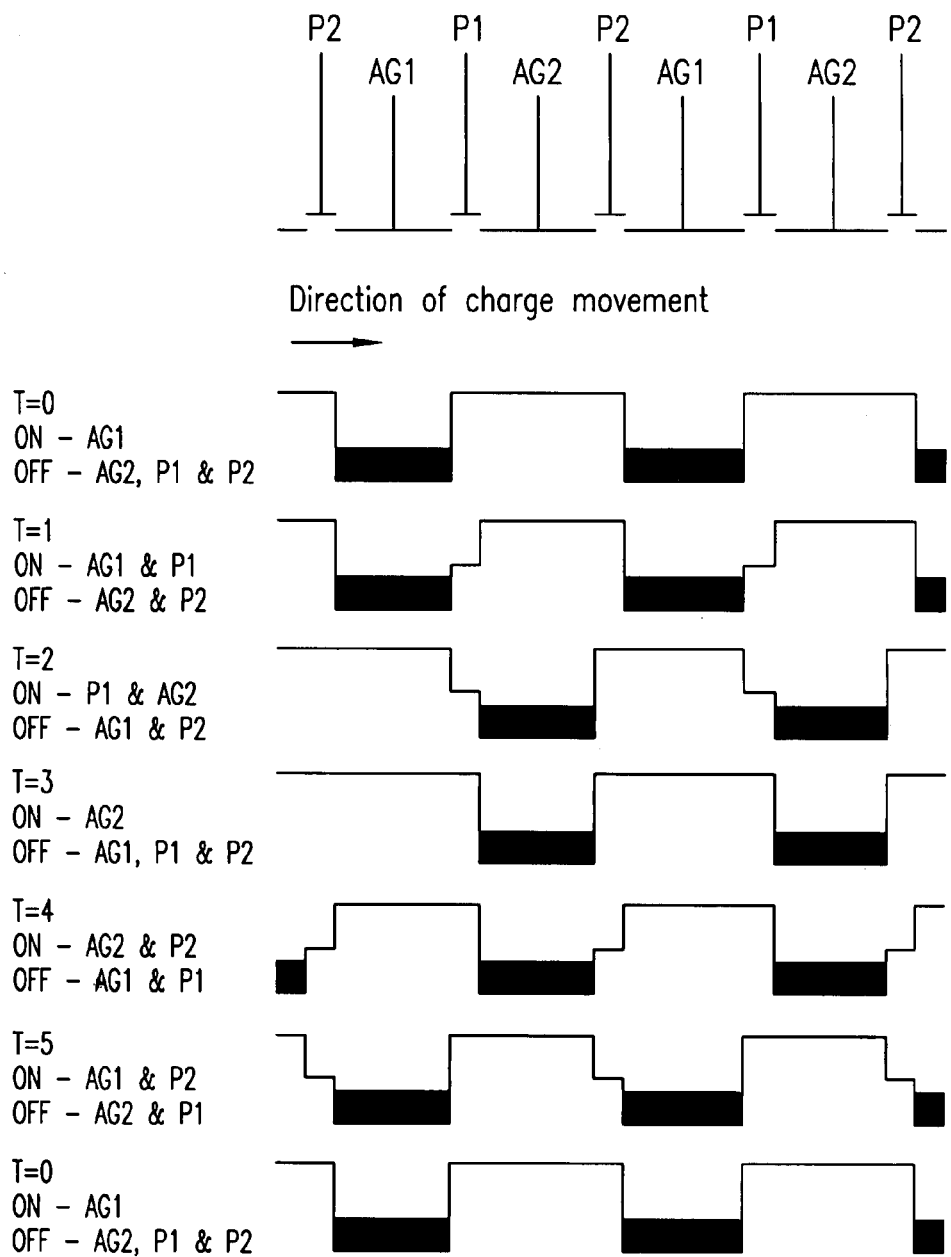

In FIG. 7, the charge transfer principal described with respect to FIGS. 5 and 6 is repeated in a shift register. Time T=0 corresponds to FIG. 5. At time T=1, the voltage applied to poly gate P1 is switched from −6 volts to −3 volts. At time T=2, the voltage applied to active gate AG2 is switched from 0 volts to 3 volts to transfer charge from well 50 to well 52. Then the process is repeated to transfer charge from well 52 to well 50 of the next pixel is succession.

Figure 1:
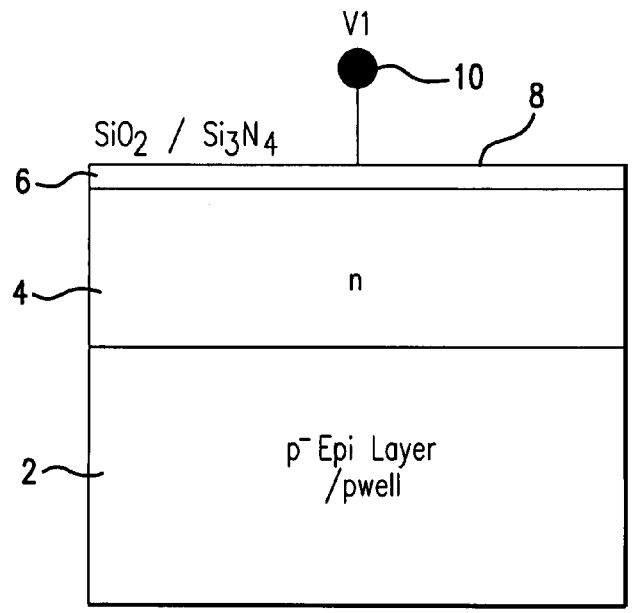
FIG. 1 is a section view of a known gate or photo gate.

Persons of ordinary skill in the art will appreciate in light of these teachings that the above described pixel functions as a 4 phase shift register element. When shielded from light, the described pixel functions as a 4 phase shift register element (see FIG. 4). A clock line is coupled to the respective contact of each active gate region, and a clock line is coupled to each poly gate electrode 30 and 40. When exposed to light (e.g., infrared, red, green, blue and UV), the described pixel functions as a combination photo diode and shift register element. Such a structure is well suited for replacing photo detectors made from photo gates (see FIG. 1). While both structures perform the shift register function, the present invention (e.g., the active gate pixel) provides improved blue and UV detection sensitivity (i.e., improved with respect to the detection sensitivity achieved by a photo gate). This improved blue and UV sensitivity heretofore required use of photo diodes and pinned photo diodes that do not achieve the shift register functionality of the present invention.

Figure 8:
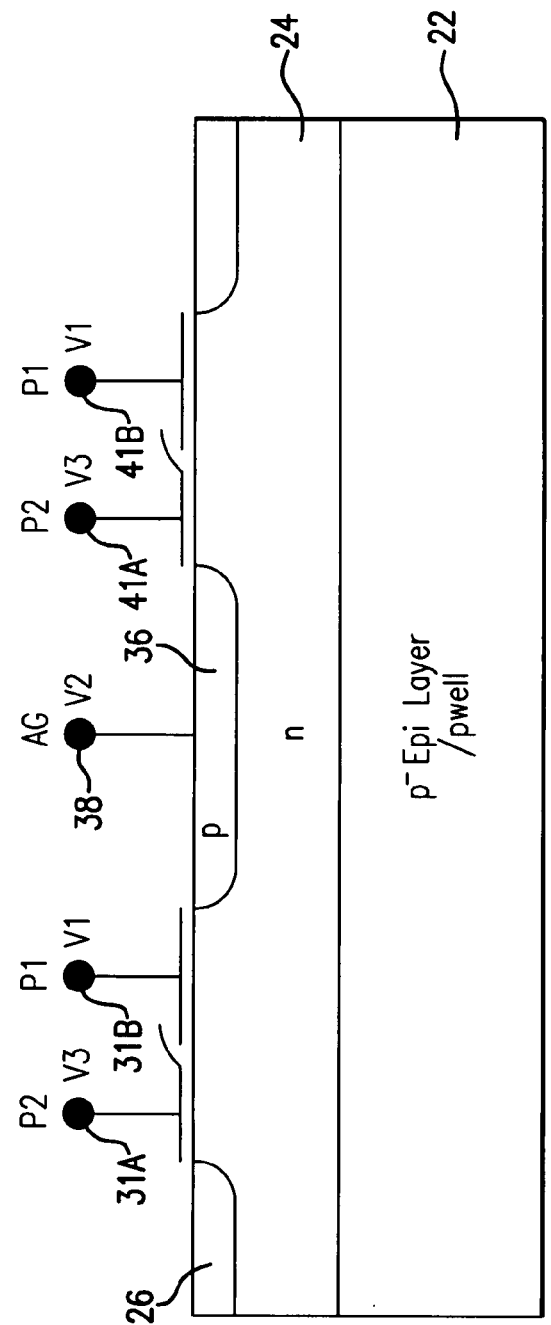
FIG. 8 is a section view of a three phase variant of the first embodiment of a pixel or register element employing an active gate according to the present invention.

In FIG. 8, each poly gate electrode (e.g., 30 and 40 of FIGS. 3 and 4) is replaced by two poly gate electrodes that are insulatively spaced from and disposed adjacent to each other (e.g., 31A and 31B or 41A and 41B). When active gate contact 38 (connected to active gate region 36) and poly gate electrodes 31A and 31B are excited by three phase clock signals, the combination of two poly gates and the active gate functions as a three phase CCD shift register element, and if irradiated by light, the active gate portion functions as a photo diode to provide superior blue and UV detection sensitivity. By replacing poly gate electrode 30 and poly gate electrode 40 in FIG. 4 with two poly gate electrodes each (e.g., 31A and 31B for electrode 30 and 41A and 41B for electrode 40), the 4 phase unit pixel depicted in FIG. 4 becomes two pixels (or shift register elements) using a 3 phase clocking structure in each. In general, the poly gate electrodes are narrow or otherwise kept to a minimum width consistent with the design rules required by the fabrication processes. However, the area of the active gate can be made arbitrarily large so long as the resulting design is also consistent with the design rules required by the fabrication processes. Thus, large pixel array fill factors can be achieved. The fill factor is the ratio of the photo responsive area of a pixel to the pixel's total area.

Figure 9:
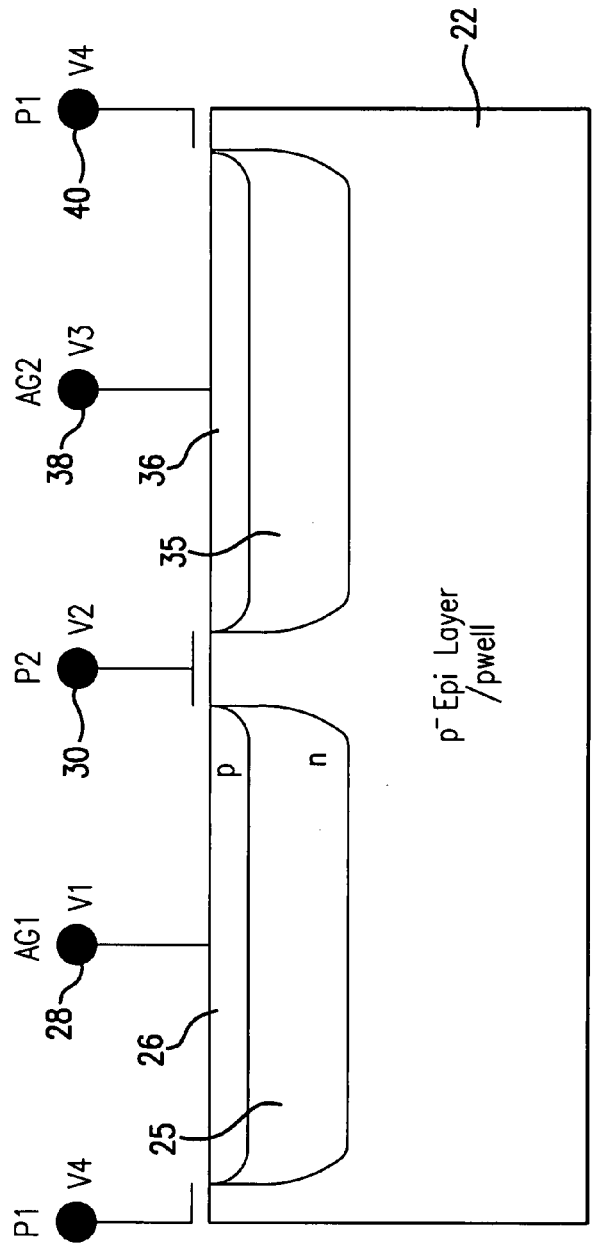
FIG. 9 is a section view of a second embodiment of a pixel or register element employing an active gate according to the present invention.

In FIG. 9, the buried channel technology of the pixel depicted in FIG. 3 is replaced with surface gated technology. Buried channel technology refers to channel 24 depicted in FIGS. 3 and 8. In buried channel technology, voltages applied to the poly gate electrodes 30 and 40 control the depths of potential wells and barriers within channel 24.

In contrast, surface channel technology (e.g., FIG. 9) has no buried channel 24 under poly gate electrodes. Instead, voltages applied to the poly gate electrodes 30 and 40 control the size of a depletion region that can be formed under the poly gate electrodes directly in substrate 22. When a small positive voltage is applied to electrodes 30 and 40, mobile positive charges (i.e., holes) in the p⁻ substrate (i.e., the majority carrier) are repelled away from the electrodes by the electric field, and minority carriers (i.e., electrons) are attracted toward the electrodes. When the applied voltage is high enough, sufficient majority carriers (i.e., holes) depart a shallow regions under the electrodes and sufficient minority carriers (i.e., electrons) collect in the shallow regions under the electrodes that the shallow regions are said to be depleted or inverted (e.g., n type electrons become the majority carrier instead of p type holes). In such an inverted state, charges in active gate channel 25 are free to be transferred to active gate channel 35 or vice versa depending on the depths of the potential wells in the active gate channels.

In FIG. 9, channel 24 of FIG. 3 has been formed in a row as a sequence of active gate channels 25, 35, etc., formed in a first portion, a second portion, etc., of the substrate. The portions of the channel (discussed with respect to FIG. 2) are defined to be in the first portion, second portion, etc. of the substrate so that first gate region 26, second gate region 36, etc., are formed in first active gate channel 25, second active channel 26, etc., respectively. Active gate channels 25 and 35 are able to electrically communicate with each other when an appropriate voltage is applied to poly gate electrode 30. In other aspects, active gate channels 25 and 35 function as channel 24 of the embodiment of FIG. 3. Active gate regions 26 and 36 are formed in active gate channels 25 and 35, respectively, as discussed with respect to FIG. 3. Metal contacts 28 and 38 are formed, and poly-crystalline silicon gate electrodes 30 and 40 are formed to complete the pixel of this embodiment. The pixel depicted in FIG. 9 operates similarly to and has advantages of the pixel depicted in FIG. 3.

In a variant of the 4 phase pixel depicted in FIG. 9, each poly gate electrode (e.g., 30 and 40 of FIGS. 3 and 4) is replaced by two poly gate electrodes that are insulatively spaced from and disposed adjacent to each other (e.g., 31A and 31B or 41A and 41B) as depicted in FIG. 8. In this way, the 4 phase pixel depicted in FIG. 9 becomes two pixels, each using a three phase clocking structure. The operation and advantages of the two 3 phase pixels is as described with respect to FIG. 8.

Figure 10:
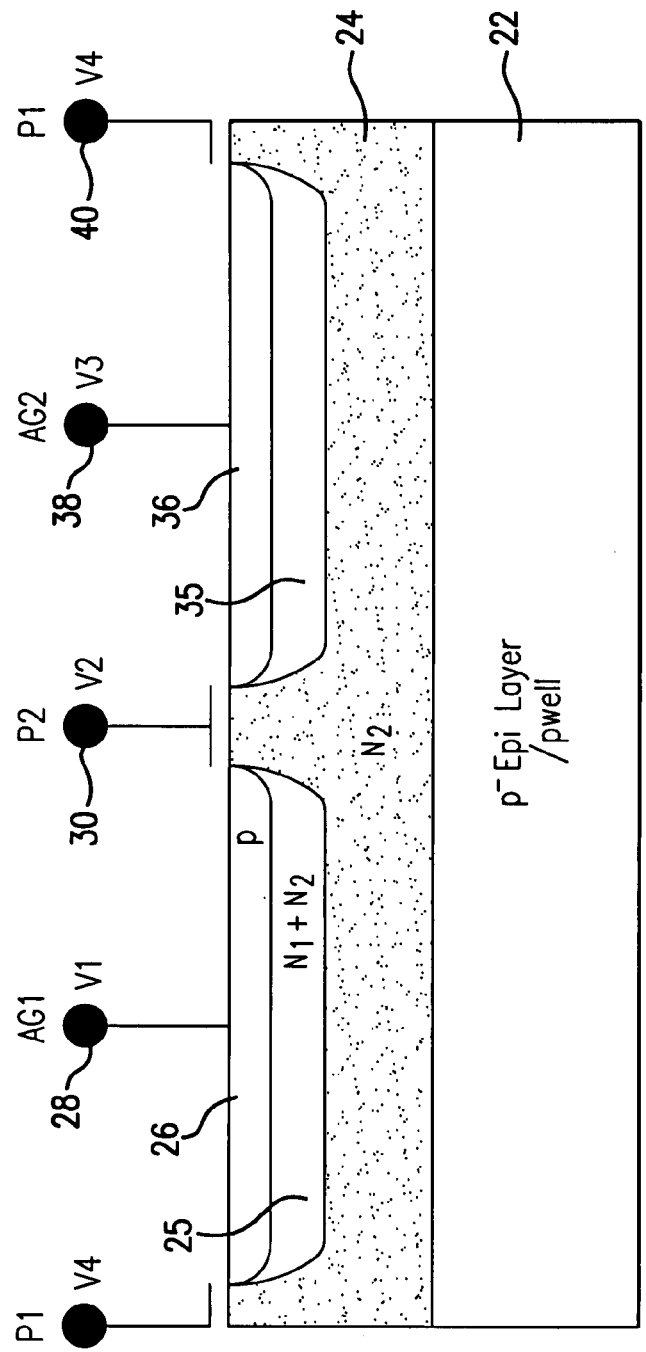
FIG. 10 is a section view of a third embodiment of a pixel or register element employing an active gate according to the present invention.

FIG. 10 depicts an alternative embodiment to that depicted in FIG. 3. In FIG. 10, the same substrate 22 and channel 24 are formed. However in the embodiment of FIG. 10, before forming the active gate regions, active gate channels 25 and 35 are formed by implant or dopant diffusion in corresponding portions of the channel. Channel 24 has a dopant concentration of N2. Active gate channels 25 and 35 are formed in portions of channel 24 to a depth shallower than a depth of channel 24 by adding dopant to increase the dopant concentration by $N_1^-$ so that active gate channels 25 and 35 have a total dopant concentration of $N_1^- + N_2$. The dopant concentration of active gate channels 25 and 35 is greater than the concentration of channel 24, but both are of the same conductivity type. Then active gate regions 26 and 36 are formed in active gate channels 25 and 35, respectively. Metal contacts 28 and 38 are formed, and poly-crystalline silicon gate electrodes 30 and 40 are formed to complete the pixel of this embodiment. The pixel depicted in FIG. 10 operates similarly to and has advantages of the pixel depicted in FIG. 3.

In a variant of the 4 phase pixel depicted in FIG. 10, each of the poly gate electrodes (e.g., 30 and 40 of FIG. 10) are replaced by two poly gate electrodes that are insulatively spaced from and disposed adjacent to each other (e.g., 31A and 31B for electrode 30 and 41A and 41B for electrode 40) as depicted in FIG. 8. In this way, the 4 phase pixel depicted in FIG. 10 becomes two pixels, each using a three phase clocking structure. The operation and advantages of the two 3 phase pixels is as described with respect to FIG. 8.

Having described preferred embodiments of a novel active gate CCD image sensor (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A device comprising:
   a substrate of a first conductivity type;
   a channel of a second conductivity type formed in the substrate;
   a first gate region of the first conductivity type formed in a corresponding first portion of the channel, the first gate region covering a first area;
   a first contact connected to the first gate region, the first contact covering a fraction of the first area;
   a second gate region of the first conductivity type formed in a corresponding second portion of the channel, the second gate region covering a second area and being spaced by a first gap from the first gate region;
   a second contact connected to the second gate region, the second contact covering a fraction of the second area;
   a first gate electrode insulatively spaced from and disposed over the first gap, the first gate electrode being spaced from and overlaying an edge of the first gate region and an edge of the second gate region;
   a first clock line coupled to the first contact;
   a second clock line coupled to the first gate electrode; and
   a third clock line coupled to the second contact.

2. A device comprising:
a substrate of a first conductivity type;
a channel of a second conductivity type formed in the substrate;
a first gate region of the first conductivity type formed in a corresponding first portion of the channel, the first gate region covering a first area;
a first contact connected to the first gate region, the first contact covering a fraction of the first area;
a second gate region of the first conductivity type formed in a corresponding second portion of the channel, the second gate region covering a second area and being spaced by a first gap from the first gate region;
a second contact connected to the second gate region, the second contact covering a fraction of the second area;
a first gate electrode insulatively spaced from and disposed over the first gap, the first gate electrode being spaced from and overlaying an edge of the first gate region and an edge of the second gate region;
a third gate region of the first conductivity type formed in a corresponding third portion of the channel, the third gate region covering a third area and being spaced by a second gap from the second gate region;
a third contact connected to the third gate region, the third contact covering a fraction of the third area;
a second gate electrode insulatively spaced from and disposed over the second gap;
a fourth gate region of the first conductivity type formed in a corresponding fourth portion of the channel, the fourth gate region covering a fourth area and being spaced by a third gap from the third gate region;
a fourth contact connected to the fourth gate region, the fourth contact covering a fraction of the fourth area;
a third gate electrode insulatively spaced from and disposed over the third gap;
a first clock line coupled to the first and third contacts;
a second clock line coupled to the first and third gate electrodes; and
a third clock line coupled to the second and fourth contacts.

3. The device of claim 2, further comprising a fourth clock line coupled to the second gate electrode.

4. A device comprising:
a substrate of a first conductivity type;
a channel of a second conductivity type formed in the substrate;
a first gate region of the first conductivity type formed in a corresponding first portion of the channel, the first gate region covering a first area;
a first contact connected to the first gate region, the first contact covering a fraction of the first area;
a second gate region of the first conductivity type formed in a corresponding second portion of the channel, the second gate region covering a second area and being spaced by a first gap from the first gate region;
a second contact connected to the second gate region, the second contact covering a fraction of the second area;
a first gate electrode insulatively spaced from and disposed over a first portion of the first gap; and
a second gate electrode insulatively spaced from and disposed over a second portion of the first gap, the second gate electrode being insulatively spaced from and disposed adjacent to the first gate electrode.

5. The device of claim 4, wherein:
the first and second gate electrodes are formed of poly-crystalline silicon; and
the first and second contacts are formed of metal.

6. The device of claim 4, further comprising first, second and third clock lines, wherein:
the first clock line is coupled to the first and second contacts;
the second clock line is coupled to the first gate electrode; and
the third clock line is coupled to the second gate electrode.

7. The device of claim 4, further comprising:
a third gate region of the first conductivity type formed in a corresponding third portion of the channel, the third gate region covering a third area and being spaced by a second gap from the second gate region;
a third contact connected to the third gate region, the third contact covering a fraction of the third area;
a third gate electrode insulatively spaced from and disposed over a first portion of the second gap;
a fourth gate electrode insulatively spaced from and disposed over a second portion of the second gap, the fourth gate electrode being insulatively spaced from and disposed adjacent to the third gate electrode;
a fourth gate region of the first conductivity type formed in a corresponding fourth portion of the channel, the fourth gate region covering a fourth area and being spaced by a third gap from the third gate region;
a fourth contact connected to the fourth gate region, the fourth contact covering a fraction of the fourth area;
a fifth gate electrode insulatively spaced from and disposed over a first portion of the third gap; and
a sixth gate electrode insulatively spaced from and disposed over a second portion of the third gap, the sixth gate electrode being insulatively spaced from and disposed adjacent to the fifth gate electrode.

8. The device of claim 7, wherein:
the first, second, third, fourth, fifth and sixth gate electrodes are formed of poly-crystalline silicon; and
the first, second, third and fourth contacts are formed of metal.

9. The device of claim 7, further comprising first, second and third clock lines, wherein:
the first clock line is coupled to the first, second, third and fourth contacts;
the second clock line is coupled to the first, third and fifth gate electrodes; and
the third clock line is coupled to the second, fourth and sixth gate electrodes.

10. The device of claim 7, further comprising:
a first channel stop on a first side of the channel; and
a second channel stop on a second side of the channel, the first and second channel stops being so disposed that the channel therebetween defines a longitudinal direction,
wherein the first, second, third and fourth gate regions are arranged successively in the longitudinal direction.

11. A device comprising:
a substrate of a first conductivity type;
a channel of a second conductivity type formed in the substrate;
a first gate region of the first conductivity type formed in a corresponding first portion of the channel, the first gate region covering a first area, wherein the channel constitutes a first active gate channel formed in a first portion of the substrate and a first portion of the channel is defined to be in the first portion of the substrate so that the first gate region is formed in the first active gate channel;
a first contact connected to the first gate region, the first contact covering a fraction of the first area;

a second active gate channel of the second conductivity type formed in a corresponding second portion of the substrate, the second active gate channel being spaced by a first gap from the first active gate channel;

a second gate region of the first conductivity type formed in the second active gate channel, the second gate region covering a second area;

a second contact connected to the second gate region, the second contact covering a fraction of the second area;

a first gate electrode insulatively spaced from and disposed over the first gap, the first gate electrode being spaced from and overlaying an edge of the first gate region and an edge of the second gate region; and first, second and third clock lines, wherein the first clock line is coupled to the first contact, the second clock line is coupled to the first gate electrode, and the third clock line is coupled to the second contact.

12. A device comprising:

a substrate of a first conductivity type;

a channel of a second conductivity type formed in the substrate;

a first gate region of the first conductivity type formed in a corresponding first portion of the channel, the first gate region covering a first area, wherein the channel constitutes a first active gate channel formed in a first portion of the substrate and a first portion of the channel is defined to be in the first portion of the substrate so that the first gate region is formed in the first active gate channel;

a first contact connected to the first gate region, the first contact covering a fraction of the first area;

a second active gate channel of the second conductivity type formed in a corresponding second portion of the substrate, the second active gate channel being spaced by a first gap from the first active gate channel;

a second gate region of the first conductivity type formed in the second active gate channel, the second gate region covering a second area;

a second contact connected to the second gate region, the second contact covering a fraction of the second area;

a first gate electrode insulatively spaced from and disposed over the first gap, the first gate electrode being spaced from and overlaying an edge of the first gate region and an edge of the second gate region;

a third active gate channel of the second conductivity type formed in a corresponding third portion of the substrate, the third active gate channel being spaced by a second gap from the second active gate channel;

a third gate region of the first conductivity type formed in the third active gate channel, the third gate region covering a third area;

a third contact connected to the third gate region, the third contact covering a fraction of the third area;

a second gate electrode insulatively spaced from and disposed over the second gap;

a fourth active gate channel of the second conductivity type formed in a corresponding fourth portion of the substrate, the fourth active gate channel being spaced by a third gap from the third active gate channel;

a fourth gate region of the first conductivity type formed in the fourth active gate channel, the fourth gate region covering a fourth area;

a fourth contact connected to the fourth gate region, the fourth contact covering a fraction of the fourth area;

a third gate electrode insulatively spaced from and disposed over the third gap; and first, second and third clock lines, wherein the first clock line is coupled to the first and third contacts, the second clock line is coupled to the first and third gate electrodes, and the third clock line is coupled to the second and fourth contacts.

13. The device of claim 12, further comprising a fourth clock line coupled to the second gate electrode.

14. A device comprising:

a substrate of a first conductivity type;

a first active gate channel of a second conductivity type formed in a first portion of the substrate;

a first gate region of the first conductivity type formed in a corresponding first portion of the channel, the first portion of the channel being defined to be in the first portion of the substrate so that the first gate region is formed in the first active gate channel, the first gate region covering a first area;

a first contact connected to the first gate region, the first contact covering a fraction of the first area;

a second active gate channel of the second conductivity type formed in a corresponding second portion of the substrate, the second active gate channel being spaced by a first gap from the first active gate channel;

a second gate region of the first conductivity type formed in the second active gate channel, the second gate region covering a second area;

a second contact connected to the second gate region, the second contact covering a fraction of the second area;

a first gate electrode insulatively spaced from and disposed over a first portion of the first gap; and a second gate electrode insulatively spaced from and disposed over a second portion of the first gap, the second gate electrode being insulatively spaced from and disposed adjacent to the first gate electrode.

15. The device of claim 14, wherein:

the first and second gate electrodes are formed of polycrystalline silicon; and the first and second contacts are formed of metal.

16. The device of claim 14, further comprising first, second and third clock lines, wherein:

the first clock line is coupled to the first and second contacts;

the second clock line is coupled to the first gate electrode; and the third clock line is coupled to the second gate electrode.

17. The device of claim 14, further comprising:

a third active gate channel of the second conductivity type formed in a corresponding third portion of the substrate, the third active gate channel being spaced by a second gap from the second active gate channel;

a third gate region of the first conductivity type formed in the third active gate channel, the third gate region covering a third area;

a third contact connected to the third gate region, the third contact covering a fraction of the third area;

a third gate electrode insulatively spaced from and disposed over a first portion of the second gap;

a fourth gate electrode insulatively spaced from and disposed over a second portion of the second gap, the fourth gate electrode being insulatively spaced from and disposed adjacent to the third gate electrode;

a fourth active gate channel of the second conductivity type formed in a corresponding fourth portion of the substrate, the fourth active gate channel being spaced by a third gap from the third active gate channel;

a fourth gate region of the first conductivity type formed in the fourth active gate channel, the fourth gate region covering a fourth area;
a fourth contact connected to the fourth gate region, the fourth contact covering a fraction of the fourth area;
a fifth gate electrode insulatively spaced from and disposed over a first portion of the third gap; and
a sixth gate electrode insulatively spaced from and disposed over a second portion of the third gap, the sixth gate electrode being insulatively spaced from and disposed adjacent to the fifth gate electrode.

18. The device of claim 17, wherein:
the first, second, third, fourth, fifth and sixth gate electrodes are formed of poly-crystalline silicon; and
the first, second, third and fourth contacts are formed of metal.

19. The device of claim 17, further comprising first, second and third clock lines, wherein:
the first clock line is coupled to the first, second, third and fourth contacts;
the second clock line is coupled to the first, third and fifth gate electrodes; and
the third clock line is coupled to the second, fourth and sixth gate electrodes.

20. The device of claim 17, further comprising:
a first channel stop on a first side of the first, second, third and fourth active gate channels; and
a second channel stop on a second side of the first, second, third and fourth active gate channels, the first and second channel stops being so disposed that an area therebetween defines a longitudinal direction,
wherein the first, second, third and fourth gate regions are arranged successively in the longitudinal direction.

21. A device comprising:
a substrate of a first conductivity type;
a channel of a second conductivity type formed in the substrate;
a first active gate channel of the second conductivity type formed in a corresponding first portion of the channel, the first active gate channel having a greater dopant concentration than a concentration of the channel;
a first gate region of the first conductivity type formed in the first active gate channel, the first gate region covering a first area;
a first contact connected to the first gate region, the first contact covering a fraction of the first area;
a second active gate channel of the second conductivity type formed in a corresponding second portion of the channel, the second active gate channel having a greater dopant concentration than the concentration of the channel;
a second gate region of the first conductivity type formed in the second active gate channel, the second gate region covering a second area and being spaced by a first gap from the first gate region;
a second contact connected to the second gate region, the second contact covering a fraction of the second area;
a first gate electrode insulatively spaced from and disposed over the first gap;
a first clock line coupled to the first contact;
a second clock line coupled to the first gate electrode; and
a third clock line coupled to the second contact.

22. A device comprising:
a substrate of a first conductivity type;
a channel of a second conductivity type formed in the substrate;
a first active gate channel of the second conductivity type formed in a corresponding first portion of the channel, the first active gate channel having a greater dopant concentration than a concentration of the channel;
a first gate region of the first conductivity type formed in the first active gate channel, the first gate region covering a first area;
a first contact connected to the first gate region, the first contact covering a fraction of the first area;
a second active gate channel of the second conductivity type formed in a corresponding second portion of the channel, the second active gate channel having a greater dopant concentration than the concentration of the channel;
a second gate region of the first conductivity type formed in the second active gate channel, the second gate region covering a second area and being spaced by a first gap from the first gate region;
a second contact connected to the second gate region, the second contact covering a fraction of the second area;
a first gate electrode insulatively spaced from and disposed over the first gap;
a third active gate channel of the second conductivity type formed in a corresponding third portion of the channel, the third active gate channel having a greater dopant concentration than the concentration of the channel;
a third gate region of the first conductivity type formed in the third active gate channel, the third gate region covering a third area and being spaced by a second gap from the second gate region;
a third contact connected to the third gate region, the third contact covering a fraction of the third area;
a second gate electrode insulatively spaced from and disposed over the second gap;
a fourth active gate channel of the second conductivity type formed in a corresponding fourth portion of the channel, the fourth active gate channel having a greater dopant concentration than the concentration of the channel;
a fourth gate region of the first conductivity type formed in the fourth active gate channel, the fourth gate region covering a fourth area and being spaced by a third gap from the third gate region;
a fourth contact connected to the fourth gate region, the fourth contact covering a fraction of the fourth area;
a third gate electrode insulatively spaced from and disposed over the third gap;
a first clock line coupled to the first and third contacts;
a second clock line coupled to the first and third gate electrodes; and
a third clock line coupled to the second and fourth contacts.

23. The device of claim 22, further comprising a fourth clock line coupled to the second gate electrode.

24. A device comprising:
a substrate of a first conductivity type;
a channel of a second conductivity type formed in the substrate;
a first active gate channel of the second conductivity type formed in a corresponding first portion of the channel, the first active gate channel having a greater dopant concentration than a concentration of the channel;
a first gate region of the first conductivity type formed in the first active gate channel, the first gate region covering a first area;
a first contact connected to the first gate region, the first contact covering a fraction of the first area;

a second active gate channel of the second conductivity type formed in a corresponding second portion of the channel, the second active gate channel having a greater dopant concentration than the concentration of the channel;

a second gate region of the first conductivity type formed in the second active gate channel, the second gate region covering a second area and being spaced by a first gap from the first gate region;

a second contact connected to the second gate region, the second contact covering a fraction of the second area;

a first gate electrode insulatively spaced from and disposed over a first portion of the first gap; and a second gate electrode insulatively spaced from and disposed over a second portion of the first gap, the second gate electrode being insulatively spaced from and disposed adjacent to the first gate electrode.

25. The device of claim 24, wherein:
the first and second gate electrodes are formed of poly-crystalline silicon; and
the first and second contacts are formed of metal.

26. The device of claim 24, further comprising first, second and third clock lines, wherein:
the first clock line is coupled to the first and second contacts;
the second clock line is coupled to the first gate electrode; and
the third clock line is coupled to the second gate electrode.

27. The device of claim 24, further comprising:
a third active gate channel of the second conductivity type formed in a corresponding third portion of the channel, the third active gate channel having a greater dopant concentration than the concentration of the channel;
a third gate region of the first conductivity type formed in the third active gate channel, the third gate region covering a third area and being spaced by a second gap from the second gate region;
a third contact connected to the third gate region, the third contact covering a fraction of the third area;
a third gate electrode insulatively spaced from and disposed over a first portion of the second gap;
a fourth gate electrode insulatively spaced from and disposed over a second portion of the second gap, the fourth gate electrode being insulatively spaced from and disposed adjacent to the third gate electrode;
a fourth active gate channel of the second conductivity type formed in a corresponding fourth portion of the channel, the fourth active gate channel having a greater dopant concentration than the concentration of the channel;
a fourth gate region of the first conductivity type formed in the fourth active gate channel, the fourth gate region covering a fourth area and being spaced by a third gap from the third gate region;
a fourth contact connected to the fourth gate region, the fourth contact covering a fraction of the fourth area;
a fifth gate electrode insulatively spaced from and disposed over a first portion of the third gap; and
a sixth gate electrode insulatively spaced from and disposed over a second portion of the third gap, the sixth gate electrode being insulatively spaced from and disposed adjacent to the fifth gate electrode.

28. The device of claim 27, wherein:
the first, second, third, fourth, fifth and sixth gate electrodes are formed of poly-crystalline silicon; and
the first, second, third and fourth contacts are formed of metal.

29. The device of claim 27, further comprising first, second and third clock lines, wherein:
the first clock line is coupled to the first, second, third and fourth contacts;
the second clock line is coupled to the first, third and fifth gate electrodes; and
the third clock line is coupled to the second, fourth and sixth gate electrodes.

30. The device of claim 27, further comprising:
a first channel stop on a first side of the channel; and
a second channel stop on a second side of the channel, the first and second channel stops being so disposed that the channel therebetween defines a longitudinal direction,
wherein the first, second, third and fourth gate regions are arranged successively in the longitudinal direction.

* * * * *